United States Patent
Liu et al.

(10) Patent No.: US 11,468,819 B2
(45) Date of Patent: Oct. 11, 2022

(54) SHIFT REGISTER CIRCUIT AND DISPLAY DEVICE

(71) Applicant: BOE TECHNOLOGY GROUP CO., LTD., Beijing (CN)

(72) Inventors: Dongni Liu, Beijing (CN); Minghua Xuan, Beijing (CN); Lei Wang, Beijing (CN); Xiaochuan Chen, Beijing (CN); Liang Chen, Beijing (CN); Li Xiao, Beijing (CN); Detao Zhao, Beijing (CN); Shengji Yang, Beijing (CN); Pengcheng Lu, Beijing (CN); Zheng Fang, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 276 days.

(21) Appl. No.: 16/614,365

(22) PCT Filed: Apr. 30, 2019

(86) PCT No.: PCT/CN2019/085286
§ 371 (c)(1),
(2) Date: Nov. 17, 2019

(87) PCT Pub. No.: WO2019/233225
PCT Pub. Date: Dec. 12, 2019

(65) Prior Publication Data
US 2021/0358384 A1 Nov. 18, 2021

(30) Foreign Application Priority Data
Jun. 5, 2018 (CN) .......................... 201810570026.8

(51) Int. Cl.
*G09G 3/3266* (2016.01)
*G09G 3/20* (2006.01)

(52) U.S. Cl.
CPC ... *G09G 3/2092* (2013.01); *G09G 2310/0267* (2013.01); *G09G 2310/0286* (2013.01)

(58) Field of Classification Search
CPC ......... G09G 3/3266; G09G 2310/0267; G09G 2300/0408; G09G 2310/021; G09G 2300/0426; G09G 2310/0286
See application file for complete search history.

(56) References Cited

U.S. PATENT DOCUMENTS 8,022,920 B2   9/2011  Kim
9,530,519 B2   12/2016 Lee et al.
(Continued)

FOREIGN PATENT DOCUMENTS

CN      1766972    5/2006
CN      1855200    11/2006
(Continued)

OTHER PUBLICATIONS

International Search Report and Written Opinion dated Jul. 29, 2019 for PCT Patent Application No. PCT/CN2019/085286.
(Continued)

*Primary Examiner* — Dennis P Joseph
(74) *Attorney, Agent, or Firm* — Xsensus LLP

(57) ABSTRACT

The present disclosure relates to the field of display technologies, and in particular, to a shift register circuit and a display device. The shift register circuit may include a plurality of GOAs for outputting scan signals to a plurality of pixel driving circuits and a plurality of EOAs for outputting control signals to the plurality of pixel driving circuits, where the GOAs and the EOAs are alternately arranged in a straight line.

18 Claims, 7 Drawing Sheets

(56) References Cited

U.S. PATENT DOCUMENTS

2008/0246697 A1   10/2008  Kim
2014/0111490 A1    4/2014  Lee et al.
2017/0154595 A1    6/2017  Kang
2018/0366065 A1* 12/2018  Yang ........................ G09G 3/20

FOREIGN PATENT DOCUMENTS

| | | |
|---|---|---|
| CN | 101281719 | 10/2008 |
| CN | 105609042 A | 5/2016 |
| CN | 105632410 A | 6/2016 |
| CN | 107863066 | 3/2018 |
| CN | 105632410 B | 4/2018 |
| CN | 105609042 B | 9/2018 |
| CN | 108777129 | 11/2018 |
| EP | 1978503 A2 | 10/2008 |
| EP | 1978503 A3 | 8/2009 |
| EP | 2725571 A1 | 4/2014 |
| EP | 2725571 B1 | 11/2016 |
| EP | 1978503 B1 | 8/2017 |
| KR | 20120024214 | 3/2012 |

OTHER PUBLICATIONS

1st Office Action dated Nov. 29, 2019 for Chinese Patent Application No. 201810570026.8.

* cited by examiner

SHIFT REGISTER CIRCUIT AND DISPLAY DEVICE

CROSS-REFERENCE TO RELATED APPLICATIONS

This application is based upon International Application No. PCT/CN2019/085286, filed on Apr. 30, 2019, which claims the benefit of and priority to Chinese Patent Application No. 201810570026.8, filed on Jun. 5, 2018, the entire contents of which are hereby incorporated by reference.

TECHNICAL FIELD

The present disclosure relates to the field of display technologies and, in particular, relates to a shift register circuit and a display device.

BACKGROUND

With the development of optical technology and semiconductor technology, flat panel displays, such as liquid crystal displays (LCDs) and organic light emitting diodes (OLEDs), have occupied the dominant position in the display field due to their characteristics of light weight, low energy consumption, fast response, good color purity, and high contrast.

It should be noted that the information disclosed in the Background section above is only for enhancement of understanding of the background of the present disclosure, and thus may include information that does not constitute prior art known to those of ordinary skill in the art.

SUMMARY

It is an object of the present disclosure to provide a shift register circuit and a display device.

According to an aspect of the present disclosure, a shift register circuit is provided, which is configured to output scan signals and control signals to a plurality of pixel driving circuits. The shift register circuit includes:

a plurality of gate on array GOAs configured to output scan signals to the plurality of pixel driving circuits; and a plurality of emission on array EOAs configured to output control signals to the plurality of pixel driving circuits;

wherein the GOAs and the EOAs are alternately arranged in a column direction.

In an exemplary embodiment of the present disclosure, when the plurality of pixel driving circuits are arranged in N rows, there are N/2 GOAs, and there are N EOAs;

N/2 cascaded GOAs and N/2 cascaded EOAs are arranged in a column and disposed on a first side of the pixel driving circuits, and N/2 cascaded EOAs are arranged in a column and disposed on a second side of the pixel driving circuits;

for the GOAs on the first side, an output terminal of the GOA in the nth row is connected to scan-signal input terminals of pixel driving circuits in the nth row and in the (n+1)th row;

for the EOAs on the first side, the EOA is disposed in the (n+1)th row, and an output terminal of the EOA in the (n+1)th row is connected to a control-signal input terminal of a pixel driving circuit in the nth row, for the EOAs on the second side, the EOA is disposed in the (n+1)th row, and an output terminal of the EOA in the (n+1)th row is connected to a control-signal input terminal of a pixel driving circuit in the (n+1)th row, where N is an even number, n is an odd number, and n N.

In an exemplary embodiment of the present disclosure, taking one display frame as a unit, input terminals of the EOAs in the second row on the first side and on the second side are alternately input with a first gate drive signal.

In an exemplary embodiment of the present disclosure, the shift register circuit further includes: N/2 cascaded GOAs disposed on a second side of the pixel driving circuits, wherein an output terminal of the GOA in the nth row is connected to scan-signal input terminals of the pixel driving circuit in the nth row and the (n+1)th row, N is an even number, n is an odd number and n E N.

In an exemplary embodiment of the present disclosure, for the GOAs on the first side, an output terminal of the GOA in the nth row is connected to reset terminals of the pixel driving circuits in the (n+2)th row and in the (n+3) the row.

In an exemplary embodiment of the present disclosure, for the GOAs on the second side, an output terminal of the GOA in the nth row is connected to reset terminals of the pixel driving circuits in the (n+2)th row and in the (n+3) the row.

In an exemplary embodiment of the present disclosure, the GOA includes:

a first switching element having a control terminal for receiving a first signal, a first terminal for receiving a second gate drive signal, and a second terminal connected to a first node;

a second switching element having a control terminal connected to the first node, a first terminal connected to a second node, and a second terminal for receiving the first signal;

a third switching element having a control terminal for receiving the first signal, a first terminal for receiving a second power signal, a second terminal connected to the second node;

a fourth switching element having a control terminal connected to the second node, a first terminal for receiving a first power signal, and a second terminal connected to the output terminal of the GOA;

a fifth switching element having a control terminal connected to a third node, a first terminal for receiving a second signal, and a second terminal connected to the output terminal of the GOA;

a sixth switching element having a control terminal connected to the second node, a first terminal for receiving the first power signal, and a second terminal connected to a fourth node;

a seventh switching element having a control terminal for receiving the second signal, a first terminal connected to the fourth node, and a second terminal connected to the first node;

an eighth switching element having a control terminal for receiving the second power signal, a first terminal connected to the first node, and a second terminal connected to the third node;

a first storage capacitor having a first terminal connected to the first terminal of the fourth switching element, and a second terminal connected to the second node; and a second storage capacitor having a first terminal connected to the third node, and a second terminal connected to the output terminal of the GOA.

In an exemplary embodiment of the present disclosure, the EOA includes:

a ninth switching element having a control terminal for receiving a third signal, a first terminal for receiving a first gate drive signal, and a second terminal connected to a fifth node;

a tenth switching element having a control terminal connected to the fifth node, a first terminal for receiving the third signal, and a second terminal connected to a sixth node;

an eleventh switching element having a control terminal connected to the sixth node, a first terminal for receiving a first power signal, and a second terminal connected to a seventh node;

a twelfth switching element having a control terminal for receiving a fourth signal, a first terminal connected to the fifth node, and a second terminal connected to the seventh node;

a thirteenth switching element having a control terminal for receiving the third signal, a first terminal for receiving a second power signal, and a second terminal connected to a sixth node;

a fourteen switching element having a control terminal connected to the sixth node, a first terminal for receiving the fourth signal, and a second terminal connected to an eighth node;

a fifteenth switching element having a control terminal for receiving the fourth signal, a first terminal connected to the eighth node, and a second terminal connected to a ninth node;

a sixteenth switching element having a control terminal connected to the fifth node, a first terminal for receiving the first power signal, and a second terminal connected to the ninth node;

a seventeenth switching element having a control terminal connected to the ninth node, a first terminal for receiving the first power signal, and a second terminal connected to the output terminal of the EOA;

an eighteenth switching element having a control terminal connected to the fifth node, a first terminal for receiving the second power signal, and a second terminal connected to the output terminal of the EOA;

a third storage capacitor having a first terminal connected to the sixth node, and a second terminal connected to the eighth node;

a fourth storage capacitor having a first terminal connected to the ninth node, and a second terminal for receiving the first power signal; and a fifth storage capacitor having a first terminal for receiving the fourth signal, and a second terminal connected to the fifth node.

In an exemplary embodiment of the present disclosure, the switching elements are all N-type thin film transistors, the first terminal of each switching element is a drain electrode, and the second terminal of each switching element is a source electrode; or the switching elements are all P-type thin film transistors, the first terminal of each switching element is a source electrode, and the second terminal of each switching element is a drain electrode.

According to an aspect of the present disclosure, a display device is provided, including the shift register circuit according to any one of the above.

It should be understood that both the foregoing general description and the following detailed description are exemplary and explanatory only and are not restrictive of the disclosure.

This section provides an overview of various implementations or examples of the techniques described in the present disclosure, and is not a comprehensive disclosure of the full scope or all features of the disclosed technology.

BRIEF DESCRIPTION OF THE DRAWINGS

The above and other features and advantages of the present disclosure will become more apparent from the detailed description of exemplary embodiments with reference to accompanying drawings. Understandably, the drawings in the following description are only some of the embodiments of the present disclosure, and other drawings may be obtained from these drawings by those skilled in the art without paying creative effort. In the drawings.

DETAILED DESCRIPTION

Figure 1:
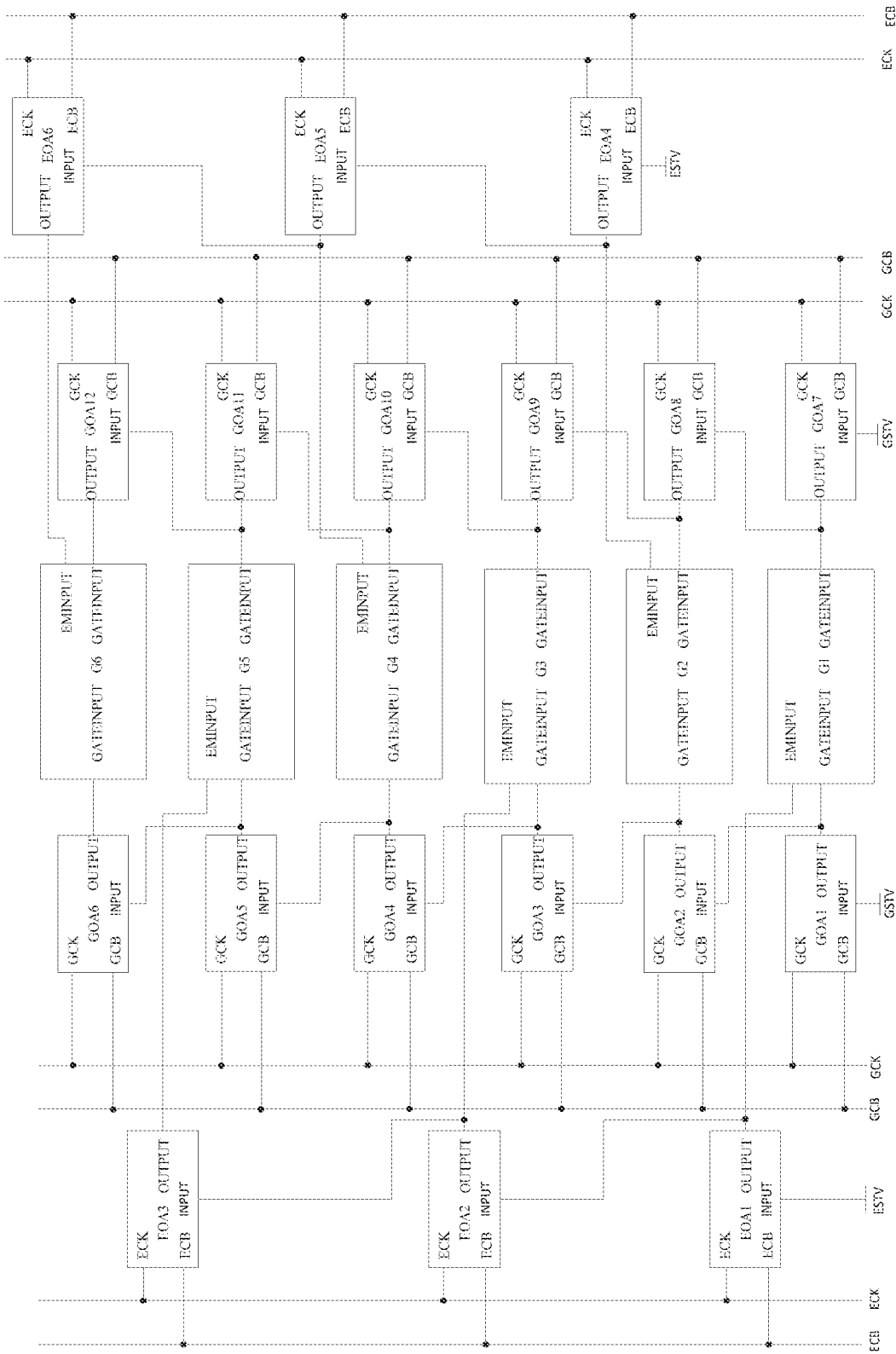
FIG. 1 is a schematic structural diagram of a shift register circuit in a comparative example of the present disclosure.

Exemplary embodiments will now be described more fully with reference to the accompanying drawings. However, the exemplary embodiments can be embodied in a variety of forms and should not be construed as being limited to the embodiments set forth herein. Rather, these embodiments are provided to make the present disclosure more thorough and complete, and to fully convey the concept of the exemplary embodiments to those skilled in the art. The described features, structures, or characteristics may be combined in any suitable manner in one or more embodiments. In the following description, numerous specific details are set forth to provide thorough understanding of the embodiments of the present disclosure. However, one skilled in the art will appreciate that the technical solution of the present disclosure may be practiced without one or more of the specific details, or other methods, components, materials, devices, steps, etc. may be employed. In other instances, well-known technical solutions are not shown or described in detail to avoid obscuring aspects of the present disclosure.

In addition, the drawings are merely schematic illustrations of the present disclosure, and are not necessarily drawn to scale. The same reference numerals in the drawings denote the same or similar parts, and the repeated description thereof will be omitted.

In a display according to a comparative embodiment of the present disclosure, each of the light emitting pixels has a separate pixel driving circuit for providing a driving current thereto. Due to the process variation of the driving transistor in each pixel driving circuit and the long-time operation, the threshold voltage of each driving transistor is drifted and inconsistent, and the driving current outputted by each pixel driving circuit is inconsistent, thereby causing uneven light emission of each pixel in the display panel. In order to solve the problem of uneven light emission of each pixel, an internal compensation method can be used, that is, a compensation circuit is constructed with a transistor in the pixel driving circuit.

However, for a pixel driving circuit, a compensation circuit, a control signal, and a scan signal are required to drive the pixel driving circuit. According to the comparative embodiment, the control signal is provided by an emission on array (EOA), the scan signal is provided by a gate on array (GOA), and the EOA and the GOA are respectively arranged in separate columns. This makes the width of the shift register circuit large, making it difficult to achieve a narrow bezel. It should be noted that the narrow bezel refers to the width of the shift register circuit on one side of the pixel driving circuits.

FIG. 1 shows a shift register circuit for providing a scan signal and a control signal to six pixel driving circuits arranged in a column in the related art. The shift register circuit includes GOA1~GOA12 and EOA1~EOA6, wherein GOA1~GOA12 represent the first GOA to the twelfth GOA; EOA1~EOA6 represent the first EOA to the sixth EOA; and G1 to G6 represent the first pixel driving circuit to the sixth pixel driving circuit. GOA1~GOA6 are arranged in a column and disposed on the left side of the pixel driving circuits for respectively providing scan signals from the left side to each pixel driving circuit, and GOA1~GOA12 are arranged in a column and disposed on the right side of the pixel driving circuits, for respectively providing scan signals from the right side to each pixel driving circuit, thereby realizing bidirectional driving. EOA1~EOA3 are arranged in a column and disposed on the left side of the pixel driving circuits for respectively providing control signals to the pixel driving circuits in odd rows, and EOA4~EOA6 are arranged in a column and disposed on the right side of the pixel driving circuits for respectively providing control signals to the pixel driving circuits in even rows. Apparently, since the EOA and the GOA are arranged in different columns, the width of the shift register circuit is large, and it is difficult to realize a narrow bezel. It should be noted that the narrow bezel refers to the width of the shift register circuit on one side of the pixel driving circuits, for example, the width of the shift register circuit on the left or right side of the pixel driving circuits in FIG. 1.

In order to solve the problem that the shift register circuit has a large width and it is difficult to realize a narrow bezel, the exemplary embodiment of the present disclosure provides a shift register circuit for outputting a scan signal and a control signal to a plurality of pixel driving circuits. The shift register circuit may include: a plurality of GOAs and a plurality of EOAs, wherein the plurality of GOAs are configured to output scan signals to the plurality of pixel driving circuits; and the plurality of EOAs are configured to output control signals to the plurality of pixel driving circuits; and the GOAs and the EOAs are alternately arranged in a straight line. It will be understood by those skilled in the art that, according to the present disclosure, "alternately arranged in a straight line" does not necessarily mean that the individual devices are strictly aligned along a straight line, but should allow a certain offset between them due to process limitations and specific design. For example, in the present disclosure, the GOAs and the EOAs may be alternately arranged in the column direction, that is, the GOAs and the EOAs are alternately arranged in a direction substantially perpendicular to the pixel row. Similar descriptions below should be understood in a similar manner.

Figure 2:
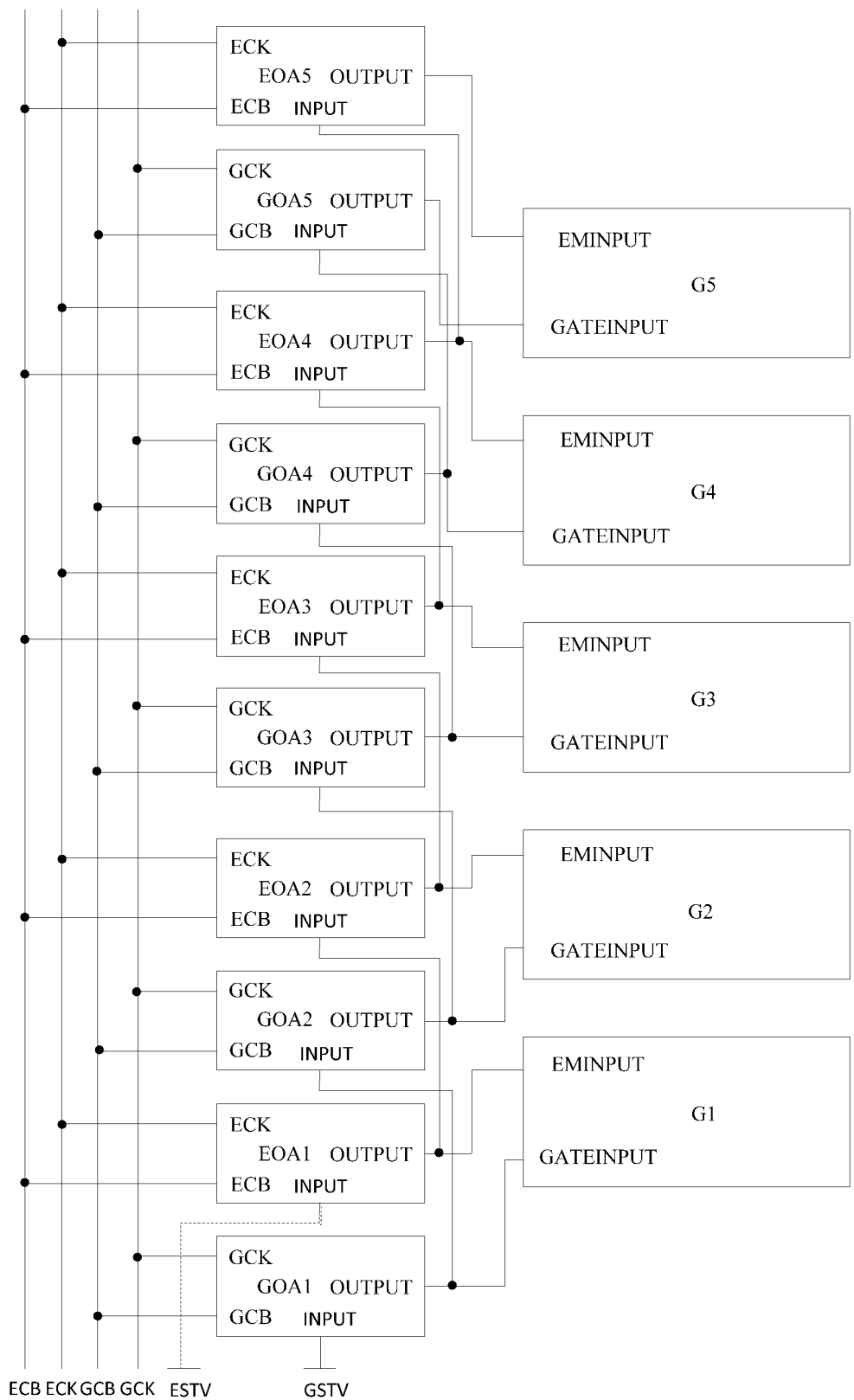
FIG. 2 is a schematic structural diagram I of a shift register circuit according to an exemplary embodiment of the present disclosure.

For example, a shift register circuit according to the exemplary embodiment of the present disclosure is provided in FIG. 2 for providing scan signals and control signals to five pixel driving circuits arranged in a column, based on which, the shift register circuit can include five cascaded GOAs and five cascaded EOAs. As shown in FIG. 1, the GOAs and the EOAs are alternately arranged in a row and disposed on the left side of the pixel driving circuits. Specifically, the GOAs are disposed in odd rows, and the EOAs are disposed in even rows. The GOA GOA1 in the first row provides a scan signal to the pixel driving circuit G1 in the first row, the EOA EOA1 in the second row provides a control signal to the pixel driving circuit G1 in the first row; the GOA GOA2 in the third row provides a scan signal to the pixel driving circuit G2 in the second row, the EOA EOA2 in the fourth row provides a control signal to the pixel driving circuit G2 in the second row; the GOA GOA3 in the fifth row provides a scan signal to the pixel driving circuit G3 in the third row, the EOA EOA3 in the sixth row provides a control signal to the pixel driving circuit G3 in the third row; the GOA GOA4 in the seventh row provides a scan signal to the pixel driving circuit G4 in the fourth row, the EOA EOA4 in the eighth row provides a control signal to the pixel driving circuit G4 in the fourth row; the GOA GOA5 in the ninth row provides a scan signal to the pixel driving circuit G5 in the fifth row, and the EOA EOA5 in the tenth row provides a control signal to the pixel driving circuit G5 in the fifth row.

Apparently, by alternately arranging the GOAs and the EOAs in a column, that is, alternately arranging them on a straight line, instead of arranging the EOAs and the GOAs in different columns, the width of the shift register circuit can be significantly reduced, which facilitates implementation of a narrow bezel.

It should be noted that the shift register circuit in FIG. 2 is merely exemplary and is not intended to limit the present disclosure. For example, the GOAs and the EOAs alternately arranged in a column may be disposed on the right side of the pixel driving circuits, and the connection relationship between the GOAs, the EOAs, and the pixel driving circuits is adjusted correspondingly according to the connection relationship in FIG. 2.

In order to share the GOAs, the structure of the shift register circuit is simplified, thereby reducing the footprint of the shift register circuit. Next, the configuration of the shift register circuit will be described by taking the case where the plurality of pixel driving circuits are arranged in N rows, where N is an even number as an example. Since the N pixel driving circuits are arranged in N rows, there are N/2 GOAs, and N EOAs.

Specifically, the N/2 cascaded GOAs and the N/2 cascaded EOAs are arranged in a column and disposed on a first side of the pixel driving circuits, and N/2 cascaded EOAs are arranged in a column and disposed on a second side of the pixel driving circuits. For example, the first side may be the left side, and the second side may be the right side, or, the first side may be the right side, and the second side may be the left side, which is not particularly limited in the exemplary embodiment. For the GOAs on the first side, the GOA is disposed in a nth row and since n is an odd number, that is, a GOA is disposed in each odd row, and an output terminal of the GOA in the nth row is connected to scan-signal input terminals of pixel driving circuits in the nth row and the (n+1)th row. For the EOAs on the first side, the EOA is disposed in a (n+1)th row, and since n is an odd number, that is, an EOA is disposed in each even row, and an output terminal of the EOA in the (n+1)th row is connected to a control-signal input terminal of a pixel driving circuit in the (n+1)th row, where n is an odd number and n∈N.

It should be noted that the output terminal of the GOA outputs a scan signal, and the output terminal of the EOA outputs a control signal.

Figure 3:
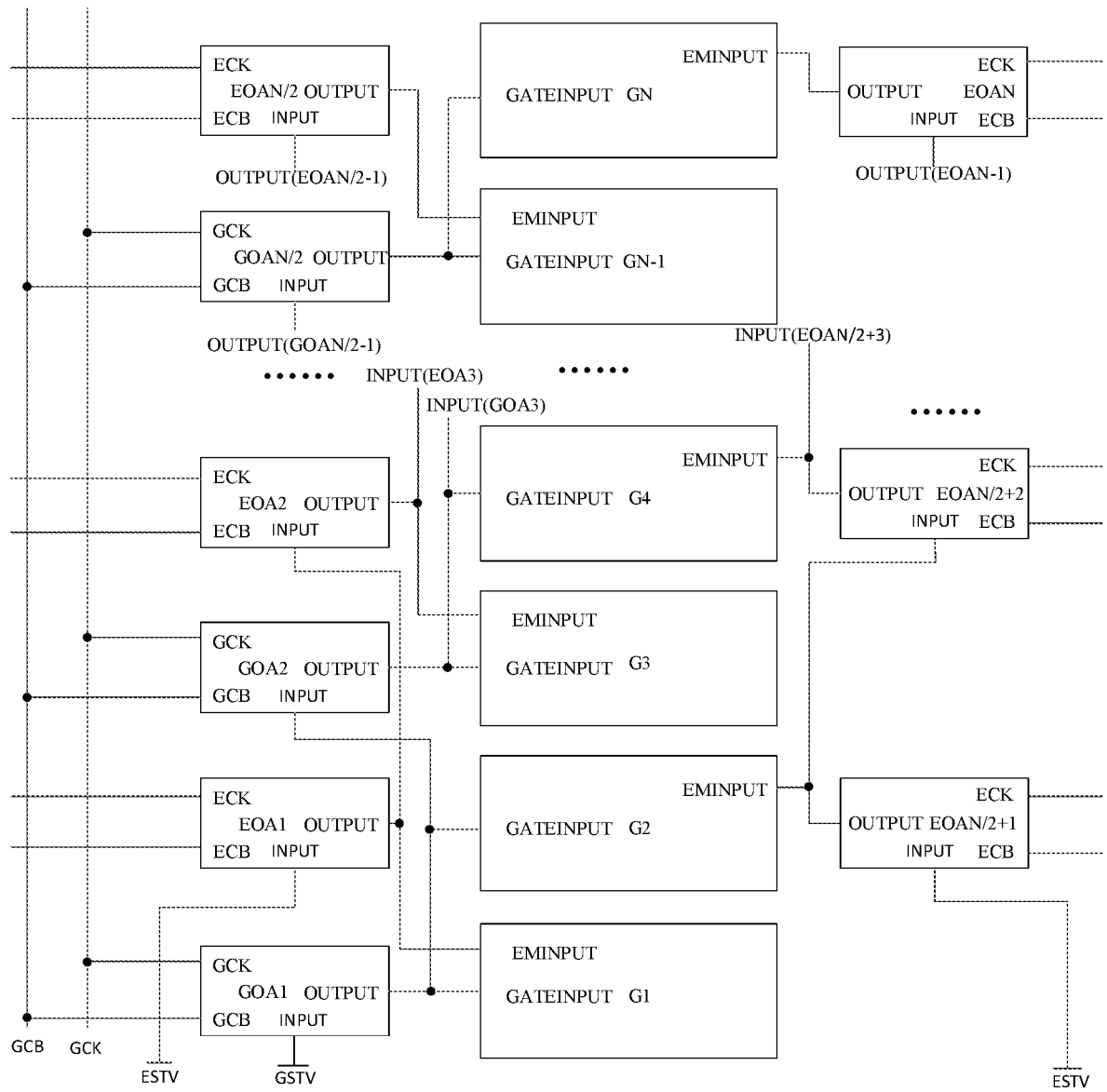
FIG. 3 is a schematic structural diagram II of a shift register circuit according to an exemplary embodiment of the present disclosure.

FIG. 3 is a schematic diagram showing the structure of a shift register circuit for providing scan signals and control signals for N pixel driving circuits arranged in N rows and 1 column.

The shift register circuit includes N/2 GOAs (i.e., GOA1~GOAN/2) and N EOAs (i.e., EOA1~EOAN). The N/2 cascaded GOAs (i.e., GOA1~GOAN/2) and N/2 cascaded EOAs (i.e., EOA1~EOAN/2) are arranged in a column and disposed on the first side (e.g., the left side) of the pixel driving circuits (i.e., G1~GN); N/2 cascaded EOAs (i.e., EOAN/2+1~EOAN) are arranged in a column and disposed on the second side (e.g., the right side) of the pixel driving circuits (i.e., G1~GN), where N is an even number and n is an odd number.

For the GOAs disposed on the first side (e.g., the left side) of the pixel driving circuits (i.e., G1 to GN), the GOA is disposed in the nth row, and since n is an odd number, the GOA is disposed in an odd row. That is, the GOAs are respectively disposed in odd rows, in other words, each odd row is provided with a GOA, and the output terminal OUTPUT of the GOA in the nth row is connected to the scan-signal input terminals GATEINPUT of the pixel driving circuits in the nth row and the (n+1)th row. That is, the GOA in the nth row simultaneously provides scan signals to the pixel driving circuits in the nth row and the (n+1)th row.

For the EOAs disposed on the first side (e.g., the left side) of the pixel driving circuits (i.e., G1 to GN), the EOA is disposed in the (n+1)th row, and since n is an odd number, the EOA is disposed in an even row. That is, the EOAs are respectively disposed in even rows, in other words, each even row is provided with an EOA, and the output terminal OUTPUT of the EOA in the (n+1)th row is connected to the control-signal input terminal EMINPUT of the pixel driving circuit in the nth row. That is, the EOA in the (n+1)th row provides a control signal to the pixel driving circuit in the nth row.

For the EOAs disposed on the second side (e.g., the right side) of the pixel driving circuits, the EOA is disposed in the (n+1)th row, and since n is an odd number, the EOA is disposed in an even row. That is, the EOAs are respectively disposed in even rows, in other words, each even row is provided with an EOA, and the output terminal OUTPUT of the EOA in the (n+1)th row is connected to the control-signal input terminal EMINPUT of the pixel driving circuit in the (n+1)th row. That is, the EOA in the (n+1)th row provides a control signal to the pixel driving circuit in the (n+1)th row.

As can be seen from the above, since one GOA provides scan signals to pixel driving circuits in two rows, it can realize multiplexing of the GOA, the number of GOAs can be reduced, and the footprint of the shift register circuit can be reduced. In addition, since the EOAs that provide control signals to the pixel driving circuits in the odd rows are located on the first side of the pixel driving circuits, and the EOAs that provide control signals to the pixel driving circuits in the even rows are located on the second side of the pixel driving circuits, the area of the shift register circuit can be further reduced.

On the basis of this, when driving the above shift register circuit to operate, taking one display frame as a unit, in each display frame, the input terminal of the GOA in the first row (e.g., GOA1 in FIG. 3) (e.g., the INPUT terminal of GOA1 in FIG. 3) is input with a second gate drive signal (e.g., the GSTV signal in FIG. 3), and, at the same time, the input terminals of the EOAs in the second rows on the first side and the second side (e.g., EOA1 and EOAN/2+1 in FIG. 3) (e.g., the INPUT terminals of EOA1 and EOAN/2+1 in FIG. 3) are input with a first gate drive signal (e.g., the ESTV signal in FIG. 3). According to the manner of providing the first gate drive signal and the second gate drive signal, the pixel driving circuits in the odd rows can realize the progressive scanning, the pixel driving circuits in the even rows can realize the progressive scanning, and the pixel driving circuits in the even rows and the pixel driving circuits in the odd rows which are connected to the same GOA can simultaneously perform display.

In order to prolong the lifetime of the shift register circuit, when driving the shift register circuit to operate, taking one display frame as a unit, in each display frame, the input terminal of the GOA in the first row (e.g., GOA1 in FIG. 3) is input with a first gate drive signal, and at the same time, the input terminals of the EOAs in the second rows on the first side and the second side are alternately input with a second gate drive signal. For example, taking 10 display frames as an example, in each display frame, the input terminal of the GOA in the first row (e.g., the INPUT terminal of GOA1 in FIG. 3) is input with a second gate drive signal (e.g., the GSTV signal in FIG. 3); in an odd frame, the input terminal of the EOA in the second row on the first side (e.g., the INPUT terminal of EOA1 in FIG. 3) is input with a first gate drive signal (e.g., the ESTV signal on the first side in FIG. 3), and in even frame, the input terminal of the EOA in the second row on the second side (e.g., the INPUT terminal of EOAN/2+1 in FIG. 3) is input with a first gate drive signal (e.g., the ESTV signal on the second side in FIG. 3). Through the above connection method, the time division driving in the odd row and the even row can be realized, that is, the pixel driving circuits in the odd rows can realize the progressive scanning, the pixel driving circuits in the even rows can realize the progressive scanning. The pixel driving circuits in the even rows and the pixel driving circuits in the odd rows which are connected to the same GOA can adopt the time division drive. It can prolong the lifetime of the shift register circuit, and since the GOAs are shared, the number of GOAs can be reduced, which facilitates implementation of a narrow bezel.

It should be noted that G1 to GN in FIG. 3 are the first pixel driving circuit to the Nth pixel driving circuit, respectively. EOA1~EOAN are the first EOA to the Nth EOA, respectively. GOA1~GOAN/2 are the first GOA to the N/2th GOA, respectively.

In order to further simplify the structure of the shift register circuit, for the GOAs on the first side, the output terminal of the GOA in the nth row is connected to the reset terminals of the pixel driving circuits in the (n+2)th row and the (n+3)th row. That is, the scan signal outputted from the output terminal of the GOA in the nth row is a reset signal of the pixel driving circuits in the (n+2)th row and the (n+3)th row.

In order to enable the pixel driving circuit to realize bidirectional driving, the shift register circuit for providing the scan signal and the control signal to the pixel driving circuits arranged in N rows may further include: N/2 cascaded GOAs disposed on the second side of the pixel driving circuits, and the GOA is disposed in the nth row, since n is an odd number, that is, a GOA is disposed in each odd row, and the output terminal of the nth row of the GOA is connected to the scan-signal input terminals of the pixel driving circuits in the nth row and the (n+1)th row, where N is an even number, n is an odd number, and n∈N.

Figure 4:
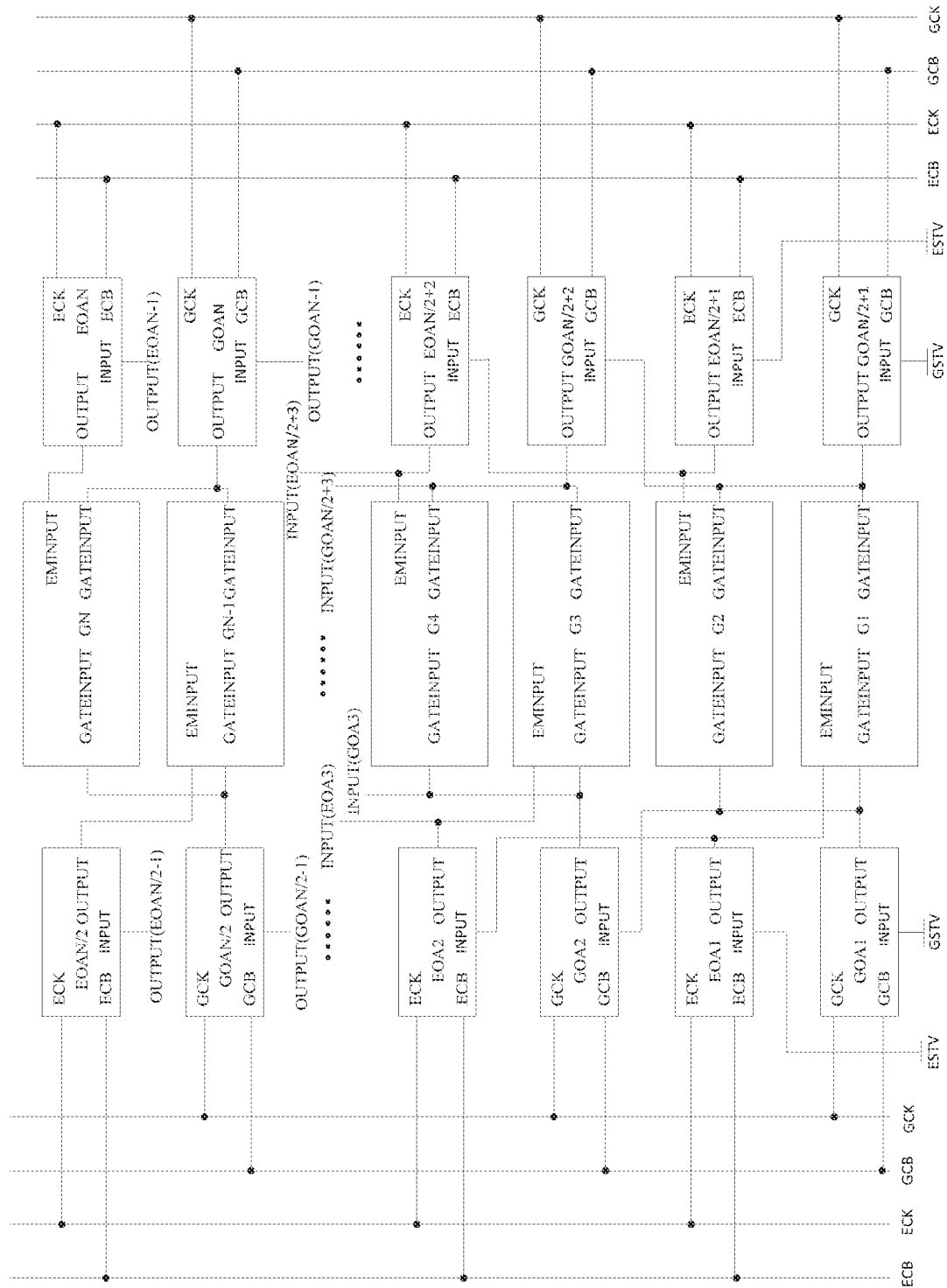
FIG. 4 is a schematic structural diagram III of a shift register circuit according to an exemplary embodiment of the present disclosure.

For example, as shown in FIG. 4, N/2 cascaded GOAs (i.e., GOAN/2+1~GOAN) are disposed on the second side (e.g., the right side) of the pixel driving circuits in FIG. 3. The GOA is disposed in the nth row. Since n is an odd number, the GOA is disposed in an odd row, that is, each GOA is respectively disposed in an odd row, in other words, each odd row is provided with a GOA. The output terminal OUTPUT of the GOA in the nth row is connected to the scan-signal input terminals GATEINPUT of the pixel driving circuits in the nth row and the (n+1)th row. That is, the GOA in the nth row simultaneously provides a scan signal to the pixel driving circuits in the nth row and the (n+1)th row.

In order to further simplify the structure of the shift register circuit, for the GOAs on the second side, the output terminal of the GOA in the nth row is connected to the reset terminal of the pixel driving circuits in the (n+2)th row and the (n+3)th row. That is, the reset signal outputted from the reset terminal of the GOA in the nth row is a reset signal of the pixel driving circuits in the (n+2)th row and the (n+3)th row.

The structural diagram of the shift register circuit in FIG. 4 is merely exemplary and is not intended to limit the present disclosure. For example, a corresponding shift register circuit can be provided for the pixel driving circuits arranged in N rows where N is odd, according to the arrangement principle in FIG. 4. Since the arrangement principle is the same as the arrangement principle in FIG. 4, it will not be repeated herein.

Figure 5:
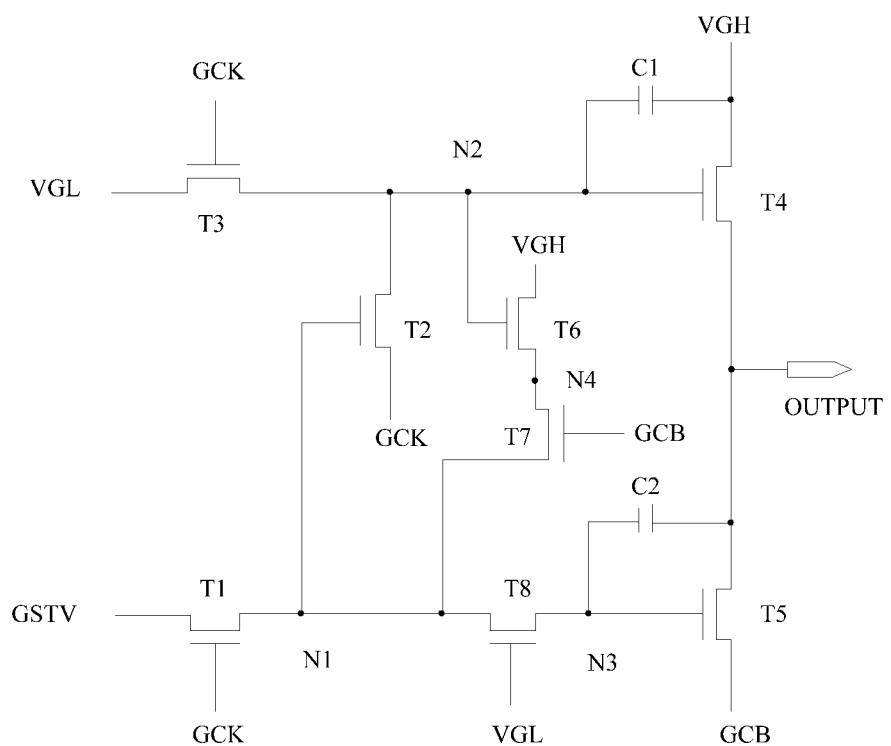
FIG. 5 is a schematic structural diagram of a gate on array (GOA) according to an exemplary embodiment of the present disclosure.

A schematic diagram of a GOA that can be applied to the shift register circuit of FIG. 3 is shown in FIG. 5. The GOA may include a first to an eighth switching elements (i.e., T1 to T8) and a first storage capacitor C1 and a second storage capacitor C2.

The first switching element T1 has a control terminal for receiving a first signal GCK, a first terminal for receiving a second gate drive signal GSTV, and a second terminal connected to a first node N1. The second switching element T2 has a control terminal connected to the first node N1, a first terminal connected to a second node N2, and a second terminal for receiving the first signal GCK. The third switching element T3 has a control terminal for receiving the first signal GCK, a first terminal for receiving a second power signal VGL, and a second terminal connected to the second node N2. The fourth switching element T4 has a control terminal connected to the second node N2, a first terminal for receiving a first power signal VGH, and a second terminal connected to the output terminal OUTPUT of the GOA. The fifth switching element T5 has a control terminal connected to a third node N3, a first terminal for receiving a second signal GCB, and a second terminal connected to the output terminal OUTPUT of the GOA. The sixth switching element T6 has a control terminal connected to the second node N2, a first terminal for receiving the first power signal VGH, and a second terminal connected to a fourth node N4. The seventh switching element T7 has a control terminal for receiving the second signal GCB, a first terminal connected to the fourth node N4, and a second terminal connected to the first node N1. The eighth switching element T8 has a control terminal for receiving the second power signal VGL, a first terminal connected to the first node N1, and a second terminal connected to the third node N3. The first storage capacitor C1 has a first terminal connected to the first terminal of the fourth switching element T4, and a second terminal connected to the second node N2. The second storage capacitor C2 has a first terminal connected to the third node N3, and a second terminal connected to the output terminal OUTPUT of the GOA.

In an exemplary embodiment of the present disclosure, the first to the eighth switching elements (T1 to T8) may correspond to the first to the eighth switching transistors, respectively. Each of the switching transistors has a control terminal, a first terminal, and a second terminal, respectively. The control terminal of each switching transistor may be a gate electrode, the first terminal of each switching transistor may be a source electrode, and the second terminal of each switching transistor may be a drain electrode; or the control terminal of each switching transistor may be a gate electrode, the first terminal of each switching transistor may be a drain electrode, and the second terminal of each switching transistor may be a source electrode. For example, when the switching elements are all P-type thin film transistors, that is, the first to the eighth switching elements (T1 to T8) may correspond to the first P-type thin film transistor to the eighth P-type thin film transistor, respectively. The first terminal of each switching element may be a source electrode, and the second terminal of each switching element may be a drain electrode. For example, when the switching elements are all N-type thin film transistors, that is, the first to the eighth switching elements (T1 to T8) may correspond to the first N-type thin film transistor to the eighth N-type thin film transistor, respectively. The first terminal of each switching element may each be a drain electrode, and the second terminal of each switching element may be source electrode. It should be noted that the above switching element may also be other types of transistors, which is not specifically limited in this exemplary embodiment.

In addition, each of the switching transistors may be an enhancement transistor or a depletion transistor, which is not specifically limited in this exemplary embodiment. It should be noted that since the source electrode and the drain electrode of the switching transistor are symmetrical, the source electrode and the drain electrode of the switching transistor can be interchanged.

Figure 6:
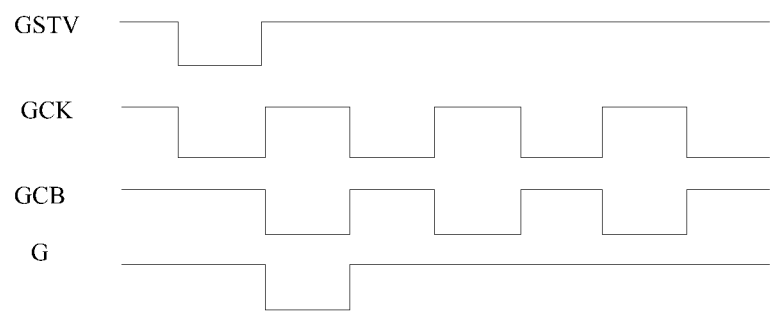
FIG. 6 is a timing chart showing the operation of the GOA of FIG. 5 according to an exemplary embodiment of the present disclosure.

The types of the first storage capacitor C1 and the second storage capacitor C2 may be selected according to the specific circuit. For example, it may be a MOS capacitor, a metal capacitor, or a double poly capacitor, and the like, which is not particularly limited in this exemplary embodiment. FIG. 6 is a timing chart showing the operation of the GOA of FIG. 5, which illustrates the first signal GCK, the second signal GCB, the first gate drive signal GSTV, and the output signal (i.e., the scan signal) G at the output terminal of the GOA.

It should be noted that FIG. 6 is a timing chart illustrating operation of the GOA when each of the switching elements in the GOA are all P-type thin film transistors. The use of a full P-type thin film transistor brings about the following advantages of for example, strong noise suppression; for example, low level conduction which is easy to implement in charge management; for example, simple manufacturing process of a P-type thin film transistor and relatively low price, for example, better stability of a P-type thin film transistor and the like.

It should be noted that, in the above specific embodiments, all the switching elements are P-type thin film transistors; however, those skilled in the art can easily obtain a GOA of all the switching elements being the N-type thin film transistors according to the GOA provided by the present disclosure. In an exemplary embodiment of the present disclosure, all of the switching elements may be N-type thin film transistors. Since the switching elements are all N-type thin film transistors, the on-signal of the switching elements is high, and the off-signal of the switching elements is a low level signal. Of course, the GOA provided by the present disclosure may also be replaced with a Complementary Metal Oxide Semiconductor (CMOS) circuit or the like, and is not limited to the GOA provided in the embodiment of the present disclosure, details of which will not be described herein.

Figure 7:
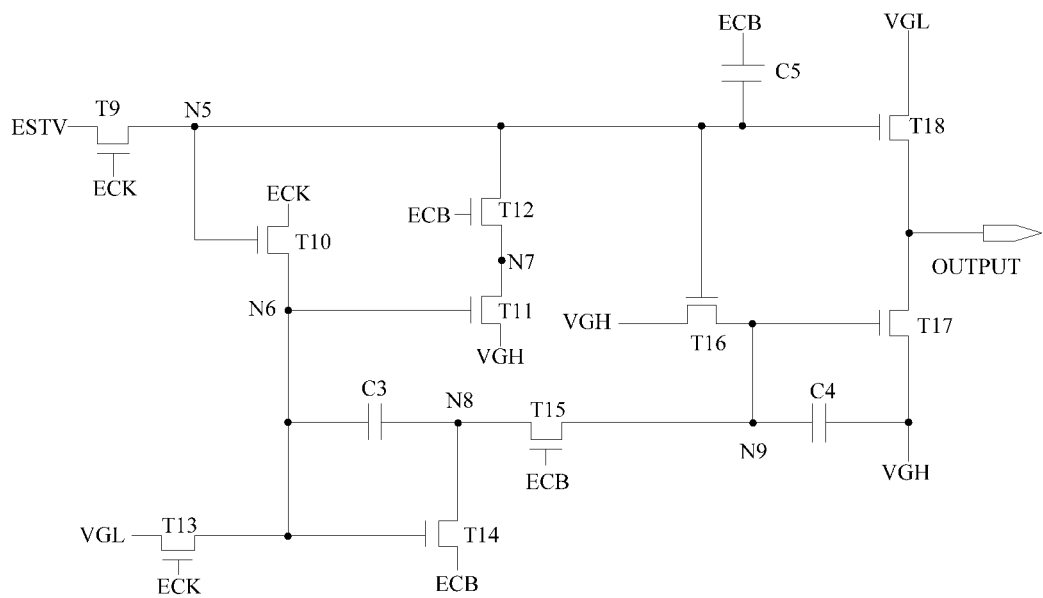
FIG. 7 is a schematic structural diagram of an emission on array (EOA) according to an exemplary embodiment of the present disclosure.

A schematic diagram of a structure of an EOA that can be applied to the shift register circuit of FIG. 3 is shown in FIG. 7. The EOA may include: a ninth to an eighteenth switching elements (i.e., T9 to T18) and a third to a fifth storage capacitors (C3 to C5).

The ninth switching element T9 has a control terminal for receiving a third signal ECK, a first terminal for receiving a first gate drive signal ESEV, and a second terminal connected to a fifth node N5. The tenth switching element T10 has a control terminal connected to the fifth node N5, a first terminal for receiving the third signal ECK, and a second terminal connected to a sixth node N6. The eleventh switching element T11 has a control terminal connected to the sixth node N6, a first terminal for receiving a first power signal VGH, and a second terminal connected to a seventh node N7. The twelfth switching element T12 has a control terminal for receiving a fourth signal ECB, a first terminal connected to the fifth node N5, and a second terminal connected to the seventh node N7. The thirteenth switching element T13 has a control terminal for receiving the third signal ECK, a first terminal for receiving a second power signal VGL, and a second terminal connected to a sixth node N6. The fourteenth switching element T14 has a control terminal connected to the sixth node N6, a first terminal for receiving the fourth signal ECB, and a second terminal connected to an eighth node N8. The fifteenth switching element T15 has a control terminal for receiving the fourth signal ECB, a first terminal connected to the eighth node N8, and a second terminal connected to a ninth node N9. The sixteenth switching element T16 has a control terminal connected to the fifth node N5, a first terminal for receiving the first power signal VGH, and a second terminal connected to the ninth node N9. The seventeenth switching element T17 has a control terminal connected to the ninth node N9, a first terminal for receiving the first power signal VGH, and a second terminal connected to an output terminal OUTPUT of the EOA. The eighteenth switching element T18 has a control terminal connected to the fifth node N5, a first terminal for receiving the second power signal VGL, and a second terminal connected to the output terminal OUTPUT of the EOA. The third storage capacitor C3 has a first terminal connected to the sixth node N6, and a second terminal connected to the eighth node N8. The fourth storage capacitor C4 has a first terminal connected to the ninth node N9, and a second terminal for receiving the first power signal VGH. The fifth storage capacitor C5 has a first terminal for receiving the fourth signal ECB, and a second terminal connected to the fifth node N5.

In an exemplary embodiment of the present disclosure, the ninth to the eighteenth switching elements (T9 to T18) may correspond to the ninth to the eighteenth switching transistors, respectively. Each of the switching transistors has a control terminal, a first terminal, and a second terminal, respectively. The control terminal of each switching transistor may be a gate electrode, the first terminal of each switching transistor may be a source electrode, and the second terminal of each switching transistor may be a drain electrode; or the control terminal of each switching transistor may be a gate electrode, the first terminal of each switching transistor may be a drain electrode and the second terminal of each switching transistor may be a source electrode. For example, when the switching elements are all P-type thin film transistors, that is, the ninth to the eighteenth switching elements (T9 to T18) may correspond to the ninth P-type thin film transistor to the eighteenth P-type thin film transistor, respectively. The first terminal of each switching element may be a source electrode, and the second terminal of each switching element may be a drain electrode. For example, when the switching elements are all N-type thin film transistors, that is, the ninth to the eighteenth switching elements (T9 to T18) may correspond to the ninth N-type thin film transistor to the eighteenth N-type thin film transistor, respectively. The first terminal of each switching element may each be a drain electrode, and the second terminal of each switching element may be source electrode. It should be noted that the above switching element may also be other types of transistors, which is not specifically limited in this exemplary embodiment.

In addition, each of the switching transistors may be an enhancement transistor or a depletion transistor, which is not specifically limited in this exemplary embodiment. It should be noted that since the source electrode and the drain electrode of the switching transistor are symmetrical, the source electrode and the drain electrode of the switching transistor can be interchanged.

The types of the third to the fifth storage capacitors (C3 to C5) may be selected according to the specific circuit. For example, it may be a MOS capacitor, a metal capacitor, or a double poly capacitor, and the like, which is not particularly limited in this exemplary embodiment.

Figure 8:
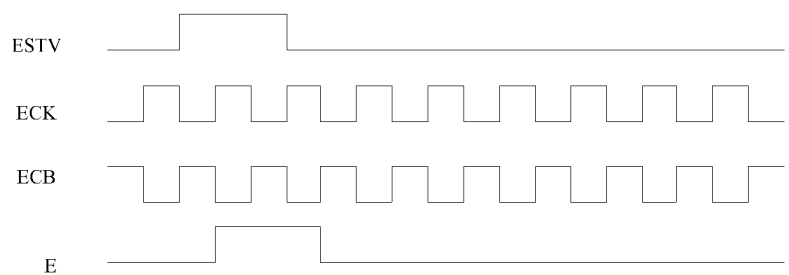
FIG. 8 is a timing chart showing the operation of the EOA of FIG. 7 according to an exemplary embodiment of the present disclosure.

FIG. 8 is a timing chart showing the operation of the EOA of FIG. 7, which illustrates the third signal ECK, the fourth signal ECB, the second gate drive signal ESTV, and the output signal (i.e. the scan signal) E of the EOA.

It should be noted that FIG. 8 is a timing chart illustrating operation of the EOA when the switching elements in the EOA are all P-type thin film transistors. The use of a full P-type thin film transistor brings about the following advantages of for example, strong noise suppression; for example, low level conduction which is easy to implement in charge management; for example, simple manufacturing process of a P-type thin film transistor and relatively low price; for example, better stability of a P-type thin film transistor and the like.

It should be noted that, in the above specific embodiments, all the switching elements are P-type thin film transistors; however, those skilled in the art can easily obtain an EOA of all the switching elements being the N-type thin film transistors according to the EOA provided by the present disclosure. In an exemplary embodiment of the present disclosure, all of the switching elements may be N-type thin film transistors. Since the switching elements are all N-type thin film transistors, the on-signal of the switching elements is high, and the off-signal of the switching elements is a low level signal. Of course, the EOA provided by the present disclosure may also be replaced with a Complementary Metal Oxide Semiconductor (CMOS) circuit or the like, and is not limited to the EOA provided in the embodiment of the present disclosure, details of which will not be described herein.

Figure 9:
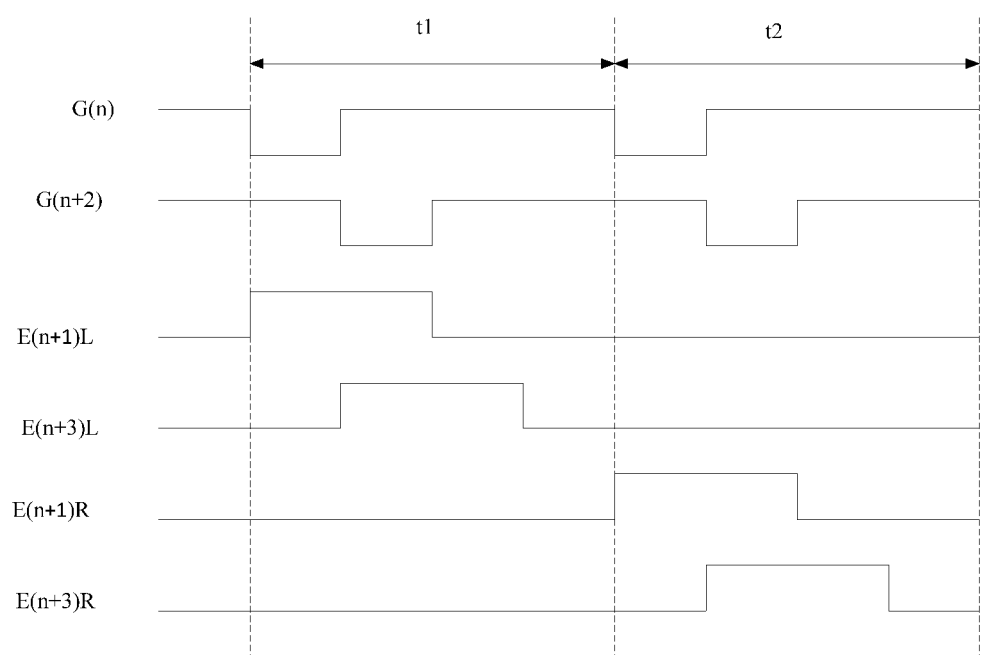
FIG. 9 is a timing chart showing the operation of the shift register circuit of FIG. 3 according to an exemplary embodiment of the present disclosure.

A timing chart showing operation of the shift register circuit of FIG. 3 is shown in FIG. 9. The timing chart shows a scan signal G(n) output from the output terminal of the GOA in the nth row, a scan signal G(n+2) output from the output terminal of the GOA in the (n+2)th row, a control signal E(n+1)L output from the output terminal of the EOA in the (n+1)th row on the first side, a control signal E(n+1)R output from the output terminal of the EOA in the (n+1)th row on the second side, a control signal E(n+3)L output from the output terminal of the EOA in the (n+3)th row on the first side, and a control signal E(n+3)R output from the output terminal of the EOA in the (n+3)th row on the second side. It should be noted that n is an odd number.

According to the connection relationship of the shift register circuit in FIG. 3, it can be seen that the GOA in the nth row simultaneously provides the scan signals to the pixel driving circuits in the nth row and the (n+1)th row, and the GOA in the (n+2)th row simultaneously provides a scan signal to the pixel driving circuits in the (n+2)th row and the (n+3)th row. The EOA in the (n+1)th row on the first side provides a control signal to the GOA in the nth row, and the EOA in the (n+1)th row on the second side provides a control signal to the GOA in the (n+1)th row. The EOA in the (n+3)th row on the first side provides a control signal to the GOA in the (n+2)th row, and the EOA in the (n+3)th row on the second side provides a control signal to the GOA in the (n+3)th row. It can be seen from the timing chart that different pixel driving circuits are driven to emit lights in different time periods through the difference in timing of the EOAs. For the pixel driving circuit in the nth row and the pixel driving circuit in the (n+1)th row, the pixel driving circuit in the nth row displays in the time period t1 and the pixel driving circuit in the (n+1)th row displays in the time period t2. For the pixel driving circuit in the (n+2)th row and the pixel driving circuit in the (n+3)th row, the pixel driving circuit in the (n+2)th row displays in the time period t1 and the pixel driving circuit in the (n+3)th row displays in the time period t2. It should be noted that although the pixel driving circuit in the nth row and the row pixel driving circuit in the (n+2)th row both display in the time period t1, the display time of the pixel driving circuit in the nth row precedes the display time of the pixel driving circuit in the (n+2)th row. Similarly, although the pixel driving circuit in the (n+1)th row and the row pixel driving circuit in the (n+3)th row both display in the time period t2, the display time of the pixel driving circuit in the (n+1)th row precedes the display time of the pixel driving circuit in the (n+3)th row. In other words, the pixel driving circuits in the odd rows and the even rows respectively perform progressive scan, but there may be overlap between the display times of the pixel driving circuits in the odd rows and the pixel driving circuits in the even rows.

The exemplary embodiment also provides a display device including the above-described shift register circuit. In the exemplary embodiment, the display device may include any product or component having a display function, such as a mobile phone, a tablet computer, a television, a notebook computer, a digital photo frame, a navigator, and the like.

A shift register circuit and a display device are provided by the exemplary embodiments of the present disclosure. The shift register circuit may include: a plurality of GOAs configured to output scan signals to a plurality of pixel driving circuits; and a plurality of EOAs configured to output control signals to the plurality of pixel driving circuits; wherein the GOAs and the EOAs are alternately arranged in a straight line. By alternately arranging the GOAs and the EOAs in a straight line instead of arranging the EOAs and the GOAs in different columns, the width of the shift register circuit can be significantly reduced, which facilitates implementation of a narrow bezel.

It should be noted that although several modules or units of a device for performing operations are mentioned in the detailed description above, such division is not mandatory. Indeed, according to embodiments of the present disclosure, the features and functions of two or more modules or units described above may be embodied in one module or unit. Conversely, the features and functions of one of the modules or units described above may be further divided into multiple modules or units.

In addition, although the various steps of the method of the present disclosure are described in a particular order in the drawings, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps, and so on.

Other embodiments of the disclosure will be apparent to those skilled in the art from consideration of the specification and practice of the disclosure disclosed herein. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

What is claimed is:

1. A shift register circuit configured to output scan signals and control signals to a plurality of pixel driving circuits, the shift register circuit comprising:
   a plurality of gate on array GOAs configured to output the scan signals to the plurality of pixel driving circuits; and
   a plurality of emission on array EOAs configured to output the control signals to the plurality of pixel driving circuits, wherein the GOAs and the EOAs are alternately arranged in a column direction;
   wherein the plurality of pixel driving circuits are arranged in N rows, the plurality of gate on array GOAs comprise N/2 first GOAs, and the plurality of emission on array EOAs comprise N/2 first EOAs and N/2 second EOAs;
   N/2 cascaded first GOAs and N/2 cascaded first EOAs are arranged in a column and disposed on a first side of the pixel driving circuits, and N/2 cascaded second EOAs are arranged in a column and disposed on a second side of the pixel driving circuits;
   an output terminal of a first GOA in an nth row is connected to scan-signal input terminals of pixel driving circuits in the nth row and in an (n+1)th row;
   an output terminal of a first EOA in the (n+1)th row is connected to a control-signal input terminal of a pixel driving circuit in the nth row;
   an output terminal of a second EOA in the (n+1)th row is connected to a control-signal input terminal of a pixel driving circuit in the (n+1)th row; and
   N is an even number, n is an odd number and n∈N.

2. The shift register circuit according to claim 1, wherein taking one display frame as a unit, input terminals of the first EOAs and the second EOA in a second row are alternately input with a first gate drive signal.

3. The shift register circuit according to claim 1, wherein the plurality of gate on array GOAs further comprise: N/2 cascaded second GOAs disposed on the second side of the pixel driving circuits, wherein an output terminal of a second GOA in the nth row is connected to scan-signal input terminals of the pixel driving circuit in the nth row and the (n+1)th row, N is an even number, n is an odd number and n∈N.

4. The shift register circuit according to claim 3, wherein the output terminal of the second GOA in the nth row is connected to reset terminals of the pixel driving circuits in an (n+2)th row and in an (n+3)the row.

5. The shift register circuit according to claim 1, wherein the output terminal of the first GOA in the nth row is connected to reset terminals of the pixel driving circuits in an (n+2)th row and in an (n+3)the row.

6. The shift register circuit according to claim 1, wherein each of the plurality of GOAs comprise comprises:
a first switching element having a control terminal for receiving a first signal, a first terminal for receiving a second gate drive signal, and a second terminal connected to a first node;
a second switching element having a control terminal connected to the first node, a first terminal connected to a second node, and a second terminal for receiving the first signal;
a third switching element having a control terminal for receiving the first signal, a first terminal for receiving a second power signal, a second terminal connected to the second node;
a fourth switching element having a control terminal connected to the second node, a first terminal for receiving a first power signal, and a second terminal connected to the output terminal of the GOA;
a fifth switching element having a control terminal connected to a third node, a first terminal for receiving a second signal, and a second terminal connected to the output terminal of the GOA;
a sixth switching element having a control terminal connected to the second node, a first terminal for receiving the first power signal, and a second terminal connected to a fourth node;
a seventh switching element having a control terminal for receiving the second signal, a first terminal connected to the fourth node, and a second terminal connected to the first node;
an eighth switching element having a control terminal for receiving the second power signal, a first terminal connected to the first node, and a second terminal connected to the third node;
a first storage capacitor having a first terminal connected to the first terminal of the fourth switching element, and a second terminal connected to the second node; and
a second storage capacitor having a first terminal connected to the third node, and a second terminal connected to the output terminal of the GOA.

7. The shift register circuit according to claim 6, wherein:
the switching elements are all N-type thin film transistors, the first terminal of each switching element is a drain electrode, and the second terminal of each switching element is a source electrode; or
the switching elements are all P-type thin film transistors, the first terminal of each switching element is a source electrode, and the second terminal of each switching element is a drain electrode.

8. The shift register circuit according to claim 1, wherein each of the plurality of EOAs comprises:

a ninth switching element having a control terminal for receiving a third signal, a first terminal for receiving a first gate drive signal, and a second terminal connected to a fifth node;
a tenth switching element having a control terminal connected to the fifth node, a first terminal for receiving the third signal, and a second terminal connected to a sixth node;
an eleventh switching element having a control terminal connected to the sixth node, a first terminal for receiving a first power signal, and a second terminal connected to a seventh node;
a twelfth switching element having a control terminal for receiving a fourth signal, a first terminal connected to the fifth node, and a second terminal connected to the seventh node;
a thirteenth switching element having a control terminal for receiving the third signal, a first terminal for receiving a second power signal, and a second terminal connected to the sixth node;
a fourteenth switching element having a control terminal connected to the sixth node, a first terminal for receiving the fourth signal, and a second terminal connected to an eighth node;
a fifteenth switching element having a control terminal for receiving the fourth signal, a first terminal connected to the eighth node, and a second terminal connected to a ninth node;
a sixteenth switching element having a control terminal connected to the fifth node, a first terminal for receiving the first power signal, and a second terminal connected to the ninth node;
a seventeenth switching element having a control terminal connected to the ninth node, a first terminal for receiving the first power signal, and a second terminal connected to the output terminal of the EOA;
an eighteenth switching element having a control terminal connected to the fifth node, a first terminal for receiving the second power signal, and a second terminal connected to the output terminal of the EOA;
a third storage capacitor having a first terminal connected to the sixth node, and a second terminal connected to the eighth node;
a fourth storage capacitor having a first terminal connected to the ninth node, and a second terminal for receiving the first power signal; and
a fifth storage capacitor having a first terminal for receiving the fourth signal, and a second terminal connected to the fifth node.

9. The shift register circuit according to, claim 8, wherein:
the switching elements are all N-type thin film transistors, the first terminal of each switching element is a drain electrode, and the second terminal of each switching element is a source electrode; or
the switching elements are all P-type thin film transistors, the first terminal of each switching element is a source electrode, and the second terminal of each switching element is a drain electrode.

10. A display device, comprising:
a plurality of pixel driving circuits and a shift register circuit configured to output scan signals and control signals to the plurality of pixel driving circuits, wherein the shift register comprises:
a plurality of gate on array GOAs configured to output the scan signals to the plurality of pixel driving circuits; and a plurality of emission on array EOAs configured to output the control signals to the plurality of pixel driving circuits, wherein the GOAs and the EOAs are alternately arranged in a column direction;

wherein the plurality of pixel driving circuits are arranged in N rows, the plurality of gate on array GOAs comprise N/2 first GOAs, and the plurality of emission on array EOAs comprise N/2 first EOAs and N/2 second EOAs;

N/2 cascaded first GOAs and N/2 cascaded first EOAs are arranged in a column and disposed on a first side of the pixel driving circuits, and N/2 cascaded second EOAs are arranged in a column and disposed on a second side of the pixel driving circuits;

an output terminal of a first GOA in an nth row is connected to scan-signal input terminals of pixel driving circuits in the nth row and in an (n+1)th row;

an output terminal of a first EOA in the (n+1)th row is connected to a control-signal input terminal of a pixel driving circuit in the nth row;

an output terminal of a second EOA in the (n+1)th row is connected to a control-signal input terminal of a pixel driving circuit in the (n+1)th row; and N is an even number, n is an odd number, and n∈N.

11. The display device according to claim 10, wherein, the output terminal of the first GOA in the nth row is connected to reset terminals of the pixel driving circuits in an (n+2)th row and in an (n+3)the row.

12. The display device according to claim 11, wherein taking one display frame as a unit, input terminals of the first EOA and the second EOA in a second row are alternately input with a first gate drive signal.

13. The display device according to claim 11, wherein the plurality of gate on array GOAs further comprise: N/2 cascaded second GOAs disposed on the second side of the pixel driving circuits, wherein an output terminal of a second GOA in the nth row is connected to scan-signal input terminals of the pixel driving circuit in the nth row and the (n+1)th row, N is an even number, n is an odd number and n∈N.

14. The display device according to claim 13, wherein, the output terminal of the second GOA in the nth row is connected to reset terminals of the pixel driving circuits in an (n+2)th row and in an (n+3)the row.

15. The display device according to claim 11, wherein each of the plurality of GOAs comprises:
a first switching element having a control terminal for receiving a first signal, a first terminal for receiving a second gate drive signal, and a second terminal connected to a first node;
a second switching element having a control terminal connected to the first node, a first terminal connected to a second node, and a second terminal for receiving the first signal;
a third switching element having a control terminal for receiving the first signal, a first terminal for receiving a second power signal, a second terminal connected to the second node;
a fourth switching element having a control terminal connected to the second node, a first terminal for receiving a first power signal, and a second terminal connected to the output terminal of the GOA;
a fifth switching element having a control terminal connected to a third node, a first terminal for receiving a second signal, and a second terminal connected to the output terminal of the GOA;

a sixth switching element having a control terminal connected to the second node, a first terminal for receiving the first power signal, and a second terminal connected to a fourth node;
a seventh switching element having a control terminal for receiving the second signal, a first terminal connected to the fourth node, and a second terminal connected to the first node;
an eighth switching element having a control terminal for receiving the second power signal, a first terminal connected to the first node, and a second terminal connected to the third node;
a first storage capacitor having a first terminal connected to the first terminal of the fourth switching element, and a second terminal connected to the second node; and
a second storage capacitor having a first terminal connected to the third node, and a second terminal connected to the output terminal of the GOA.

16. The display device according to claim 15, wherein:
the switching elements are all N-type thin film transistors, the first terminal of each switching element is a drain electrode, and the second terminal of each switching element is a source electrode; or
the switching elements are all P-type thin film transistors, the first terminal of each switching element is a source electrode, and the second terminal of each switching element is a drain electrode.

17. The display device according to claim 11, wherein each of the plurality of EOAs comprises:
a ninth switching element having a control terminal for receiving a third signal, a first terminal for receiving a first gate drive signal, and a second terminal connected to a fifth node;
a tenth switching element having a control terminal connected to the fifth node, a first terminal for receiving the third signal, and a second terminal connected to a sixth node;
an eleventh switching element having a control terminal connected to the sixth node, a first terminal for receiving a first power signal, and a second terminal connected to a seventh node;
a twelfth switching element having a control terminal for receiving a fourth signal, a first terminal connected to the fifth node, and a second terminal connected to the seventh node;
a thirteenth switching element having a control terminal for receiving the third signal, a first terminal for receiving a second power signal, and a second terminal connected to the sixth node;
a fourteenth switching element having a control terminal connected to the sixth node, a first terminal for receiving the fourth signal, and a second terminal connected to an eighth node;
a fifteenth switching element having a control terminal for receiving the fourth signal, a first terminal connected to the eighth node, and a second terminal connected to a ninth node;
a sixteenth switching element having a control terminal connected to the fifth node, a first terminal for receiving the first power signal, and a second terminal connected to the ninth node;
a seventeenth switching element having a control terminal connected to the ninth node, a first terminal for receiving the first power signal, and a second terminal connected to the output terminal of the EOA;
an eighteenth switching element having a control terminal connected to the fifth node, a first terminal for receiving the second power signal, and a second terminal connected to the output terminal of the EOA;
a third storage capacitor having a first terminal connected to the sixth node, and a second terminal connected to the eighth node;
a fourth storage capacitor having a first terminal connected to the ninth node, and a second terminal for receiving the first power signal; and
a fifth storage capacitor having a first terminal for receiving the fourth signal, and a second terminal connected to the fifth node.

18. The display device according to claim 17, wherein:
the switching elements are all N-type thin film transistors, the first terminal of each switching element is a drain electrode, and the second terminal of each switching element is a source electrode; or
the switching elements are all P-type thin film transistors, the first terminal of each switching element is a source electrode, and the second terminal of each switching element is a drain electrode.

* * * * *